United States Patent
Solomko et al.

(10) Patent No.: US 12,199,596 B2
(45) Date of Patent: Jan. 14, 2025

(54) MOSFET-BASED RF SWITCH WITH CHARGE REDUCTION

(71) Applicant: Infineon Technologies AG, Neubiberg (DE)

(72) Inventors: Valentyn Solomko, Munich (DE); Semen Syroiezhin, Erlangen (DE); Andreas Bänisch, Grünwald (DE)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 18/327,525

(22) Filed: Jun. 1, 2023

(65) Prior Publication Data

US 2024/0405763 A1  Dec. 5, 2024

(51) Int. Cl.
*H03K 17/10* (2006.01)
*H03K 17/687* (2006.01)
*H03K 19/0185* (2006.01)

(52) U.S. Cl.
CPC ....... *H03K 17/102* (2013.01); *H03K 17/6871* (2013.01); *H03K 19/018507* (2013.01)

(58) Field of Classification Search
CPC ............. H03K 17/102; H03K 17/6871; H03K 19/018507
See application file for complete search history.

(56) References Cited

U.S. PATENT DOCUMENTS

2012/0098587 A1* 4/2012 Nakahara ......... H03K 17/08122
  327/425
2017/0272066 A1* 9/2017 Scott .................... H03K 17/161

* cited by examiner

Primary Examiner — Metasebia T Retebo
(74) Attorney, Agent, or Firm — Slater Matsil, LLP

(57) ABSTRACT

An RF switch device includes transistors coupled in series to form a current path; a drain-source resistive bias network coupled to a drain and a source of each transistor; and a discharge switch coupled between a gate of at least one transistor and the drain-source resistive bias network, wherein the discharge switch establishes a current path between the gate of the at least one transistor and the drain-source resistive bias network only during a switching transient of the RF switch device.

20 Claims, 12 Drawing Sheets

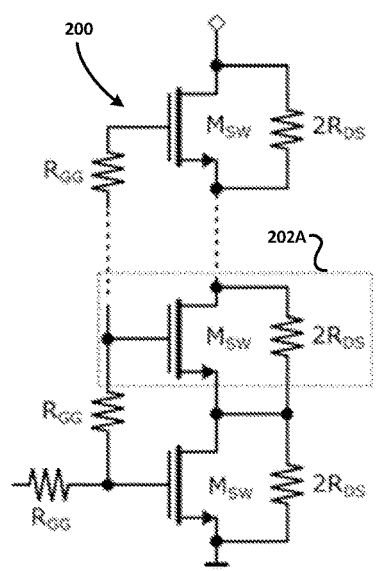
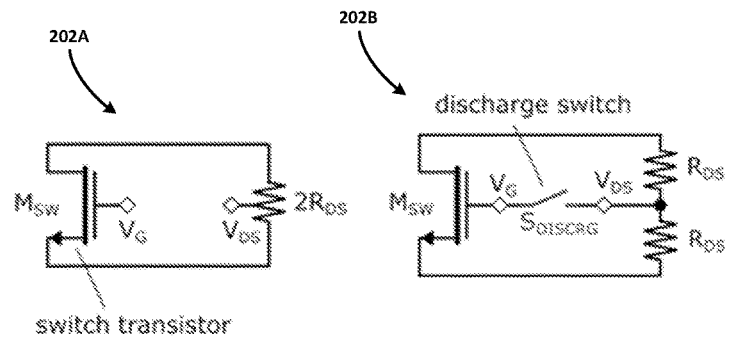
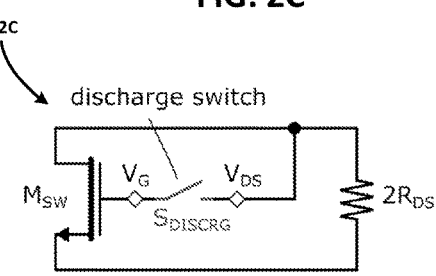
FIG. 2A
FIG. 2B
FIG. 2C
FIG. 2D

FIG. 2E  FIG. 2F

MOSFET-BASED RF SWITCH WITH CHARGE REDUCTION

TECHNICAL FIELD

The present invention relates generally to a MOSFET-based RF switch with charge reduction and, in particular embodiments, to a corresponding method.

BACKGROUND

MOSFET-based integrated circuit RF switches are known in the art. One application of MOSFET-based RF switches is in the area of antenna tuning switchable elements, particularly as high voltage antenna tuning switches and tunable passive components like C-tuners, Z-tuners, and the like. The RF switches are typically used in cellular handheld devices to tune the impedance and radiation properties of compact antennas. The RF switches are typically attached between the feed or aperture points of an antenna and ground via external SMD capacitors or inductors.

A typical challenge in antenna tuning switches design is to achieve high voltage handling at RF frequencies, reaching values of 45 V peak for the mid-voltage class and 80V or above for high-voltage class, while providing low on-state resistance, typically in the 1-Ohm range or even lower. The RF switches are implemented as stacked MOSFET devices on a silicon substrate. The above-mentioned requirements imply that a high stack size (in the range of 20 to 35 transistors) is used for achieving voltage handling, wherein each transistor is configured to have a very wide channel for achieving the specified on-state resistance in the large stack.

For proper operation, the MOSFET-based RF switches are biased to a desired operating point using high-ohmic linear resistors. A high-resistive DC path is provided for all terminals, including gate, source and drain terminals. The bias voltage is generated by charge pumps, providing at least two voltage levels-negative for off-state biasing and positive for the on-state biasing. These voltage levels are applied to the switch control terminal via a level shifter.

The current provided by the charge pumps in steady-state of the switch or under RF excitation of the switch is measured in single-digit microamps, meaning that a compact charge pump with weak driving strength may be sufficient for fulfilling the biasing requirements for the switch.

However, during a switching transient, the gate oxide capacitance of the MOSFETs in stack of RF switches is recharged, causing large load current peaks at the charge-pump output. These peaks can either substantially slow down the switching process for the case of a weak charge pump or they may require stronger charge pump to cope with the high instant load current conditions. The latter might result in more complex or bigger charge pump in the monolithically-integrated RF switching device.

SUMMARY

According to an embodiment, an RF switch device comprises a plurality of transistors coupled in series to form a current path; a drain-source resistive bias network coupled to a drain and a source of each transistor in the plurality of transistors; and a discharge switch coupled between a gate of at least one transistor in the plurality of transistors and the drain-source resistive bias network, wherein the discharge switch is configured to establish a current path between the gate of the at least one transistor in the plurality of transistors and the drain-source resistive bias network only during a switching transient of the RF switch device.

According to an embodiment, an RF switch device comprises a plurality of transistors coupled in series to form a current path; and a drain-source resistive bias network coupled to each transistor in the plurality of transistors, wherein the RF switch device is configured to establish a current path between a gate of at least one transistor in the plurality of transistors and the drain-source resistive bias network only during a discharge phase of a switching transient of the RF switch device.

According to an embodiment, a method of operating an RF switch device comprises coupling a plurality of transistors in series to form a current path; coupling a drain-source resistive bias network to each transistor in the plurality of transistors; and establishing a current path between a gate of at least one transistor in the plurality of transistors and the drain-source resistive bias network only during a discharge phase of a switching transient of the RF switch device.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A is a schematic diagram of an RF switch portion of the exemplary RF switch of FIG. 1A;

FIG. 2B is a schematic diagram of a single transistor and an associated drain-source resistor of the RF switch portion of FIG. 2A;

FIG. 2C is a schematic diagram of the single transistor and the associated drain-source resistor of the RF switch portion of FIG. 2A, and also including a discharge switch coupled between a gate of the single transistor and a center tap of the drain-source resistor, according to an embodiment;

FIG. 2D is a schematic diagram of the single transistor and the associated drain-source resistor of the RF switch portion of FIG. 2A, and also including a discharge switch coupled between a gate of the single transistor and a drain of the single transistor, according to an embodiment;

FIG. 2E is a schematic diagram of an NMOS transistor embodiment of the discharge switch;

FIG. 2F is a schematic diagram of a PMOS transistor embodiment of the discharge switch;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, an RF switch device arrangement described in further detail herein comprises a plurality of MOSFETs coupled in series to create an RF conductive current path through the channels of the transistors, a drain-source resistive bias network arranged to provide a DC conductive bias path between the drain and source terminals of the MOSFETs in stack, and a discharge switch coupled between the gate of at least one of the MOSFETs in the stack and the resistive bias network, wherein the discharge switch is configured to establish a current path between the gate and the drain-source resistive network during the discharge phase of a switching transient and break the current path otherwise.

Figures 1A, 1B:
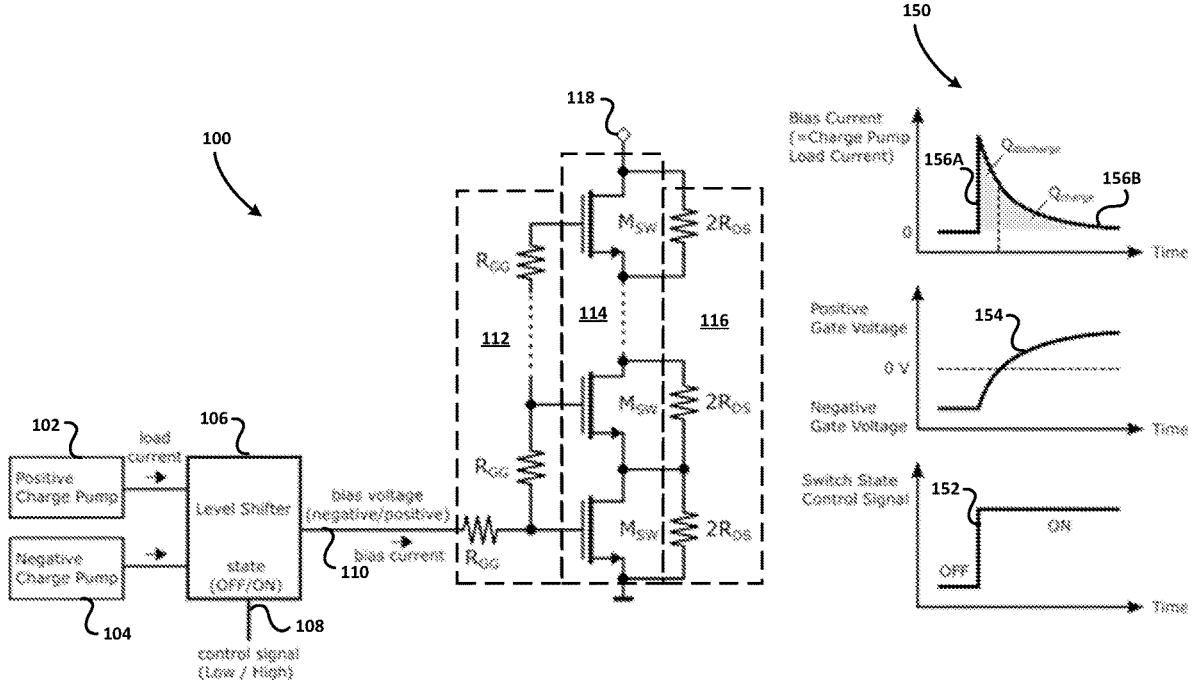
FIG. 1A is a schematic diagram of an exemplary RF switch including a level shifter, a positive charge pump, and a negative charge pump.
FIG. 1B is a timing diagram associated with the exemplary RF switch of FIG. 1A.

FIG. 1A is a schematic diagram of an exemplary RF switch 100 including a level shifter 106, a positive charge pump 102, and a negative charge pump 104. The positive charge pump 102 provides a positive voltage to the level shifter 106, as well as the corresponding load current. The negative charge pump 104 provides a negative voltage to the level shifter 106, as well as the corresponding load current. Level shifter 106 receives a digital control signal at node 108 that switches between a low value and a high value. When the digital control signal is at a low value the level shifter supplies a negative voltage to the exemplary RF switch 100. When the digital control signal is at a high value the level shifter supplies a positive voltage to the exemplary RF switch 100. The negative and positive bias voltages, as well as the corresponding bias currents are supplied to a gate resistive network 112 comprising a plurality of gate bias resistors designated $R_{GG}$. The gate resistive network 112, in turn, is coupled to a plurality of serially coupled transistors 114 in a stacked arrangement. Each transistor in the stacked arrangement is designated $M_{SW}$. The drain and source of each transistor in the stacked arrangement are in turn coupled to the drain-source resistive network 116. Each resistor in the drain-source resistive network 116 is designated $2*R_{DS}$. The drain of a topmost transistor $M_{SW}$ and the top end of a topmost drain-source resistor are coupled to a source of positive voltage at node 118. The source of a bottommost transistor $M_{SW}$ and the bottom end of a bottommost drain-source resistor are coupled to ground.

FIG. 1B is a timing diagram 150 associated with the exemplary RF switch 100 of FIG. 1A. Trace 152 shows the switch state of the control signal transitioning from an OFF state to an ON state. Trace 154 shows the transition of the bias voltage of level shifter 106 from a negative gate voltage associated with the OFF state of the RF switch through a zero voltage, and on to a positive gate voltage associated with the ON state of the RF switch. Traces 156A and 156B show the bias current (charge pump load current) during a switching transient. The switching transient comprises two phases: a discharge phase shown by trace 156A, during which the gate oxide of transistor $M_{SW}$ is discharged from the initial bias voltage to zero gate-source voltage; and a charge phase, during which the gate oxide is charged from zero volts to the new gate-source voltage corresponding to the set state of the switch. The total gate oxide charge during the discharge phase shown by trace 156A is designated $Q_{discharge}$, and the total charge during the charge phase shown by trace 156B is designated $Q_{charge}$. The bias current peak during the switching transient always occurs in the discharge phase of the switch shown by trace 156A. The amount of charge $Q_{discharge}$ delivered in the discharge phase is comparable with $Q_{charge}$, with the difference between them being in the range of 30% to 70% depending on switching direction and the bias voltage levels.

According to embodiments described in further detail below, a MOSFET-based RF switch advantageously reduces the peak load current and the overall charge taken from the charge pump during switching transient, particularly during discharge phase of the switching transient, while sustaining the switching time or even reducing the switching time of the RF switch and keeping the charge pump circuits unchanged.

FIG. 2A is a schematic diagram of an RF switch portion 200 of the exemplary RF switch of FIG. 1A, showing in particular the gate resistive bias network including the plurality of $R_{GG}$ resistors, the plurality of serially-coupled transistors $M_{SW}$, and the drain-source resistive bias network including the plurality of $2*R_{DS}$ resistors. FIG. 2B is a schematic diagram of a further switch portion 202A including a single transistor $M_{SW}$ and an associated drain-source resistor $2*R_{DS}$ of the RF switch portion 200 of FIG. 2A. In particular, the single transistor $M_{SW}$ includes a gate terminal designated $V_G$, and the drain-source resistor (which can be considered a resistor divider) includes a center tap terminal designated $V_{DS}$.

FIG. 2C is a schematic diagram of the further switch portion 202A including the single transistor $M_{SW}$ and the associated drain-source resistor $2*R_{DS}$ (as a serial combination of two resistors $R_{DS}$ in a resistor divider configuration) of the RF switch portion 200 of FIG. 2A, and also including a discharge switch $S_{DISCRG}$ coupled between a gate ($V_G$) of the single transistor and a center tap (VDS) of the drain-source resistor, according to an embodiment. In most embodiments, all transistors $M_{SW}$ include the accompanying discharge switch $S_{DISCRG}$ for the ease of a regular structure implementation. However, some embodiments comprise only a subset of transistors $M_{SW}$ with an accompanying discharge switch $S_{DISCRG}$. Depending upon ratio of switch transistors to discharge switches used, customer requirements may be fulfilled. However, in all embodiments, at least one of the transistors $M_{SW}$ include a corresponding discharge switch $S_{DISCRG}$.

FIG. 2D is a schematic diagram of an alternative further switch portion 202B including the single transistor $M_{SW}$ and the associated drain-source resistor 2*RDS of the RF switch portion 200 of FIG. 2A, and also including a discharge switch $S_{DISCRG}$ coupled between a gate of the single transistor (VG) and a drain of the single transistor, according to another embodiment.

FIGS. 2C and 2D thus show embodiment variants of the discharge circuit arrangement. FIG. 2C illustrates an embodiment wherein the discharge switch $S_{DISCRG}$ is coupled to a center-tap between two $R_{DS}$ resistors. FIG. 2D illustrates an embodiment wherein discharge switch $S_{DISCRG}$ is not coupled to the center-tap of the drain-source bias resistors, but coupled to the source/drain terminals of transistor $M_{SW}$ via the two $R_{DS}$ resistors having a total value 2*RDS. In other words, in the embodiment of FIG. 2D, the resistor $2*R_{DS}$ can be implemented as a single high value resistor.

In various embodiments, the discharge switch $S_{DISCRG}$ is implemented as an NMOS transistor, a PMOS transistor, or a parallel connection thereof. The control signal for the PMOS and NMOS devices is typically different to provide the required functionality. Each of the NMOS and PMOS devices in the parallel combination may be used to perform discharge in one particular direction. For example, the NMOS switch may be used to discharge from the ON to the OFF state of the switch, whereas the PMOS switch may be used to discharge from the OFF to the ON state, or vice versa.

FIG. 2E is a schematic diagram of an NMOS transistor embodiment 204A of the discharge switch, wherein the drain and source form the current path of the switch, and wherein the gate forms the control node of the switch.

FIG. 2F is a schematic diagram of a PMOS transistor embodiment 204B of the discharge switch, wherein the drain and source form the current path of the switch, and wherein the gate forms the control node of the switch.

Figure 2G:
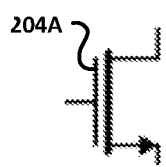
FIG. 2G is a schematic diagram of a parallel combination of an NMOS transistor and a PMOS transistor embodiment of the discharge switch.
Figure 2G:
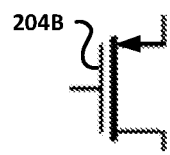
Figure 2G:
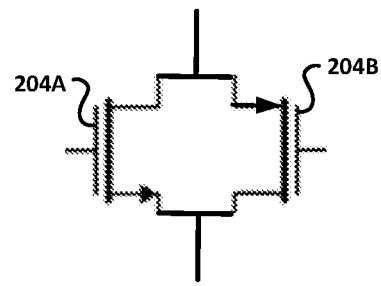

FIG. 2G is a schematic diagram of a parallel combination of an NMOS transistor embodiment 204A and a PMOS transistor embodiment 204B of the discharge switch, wherein the coupled drains and sources form the current path of the switch, and wherein the gates form separate control nodes of the switch.

Figure 3A:
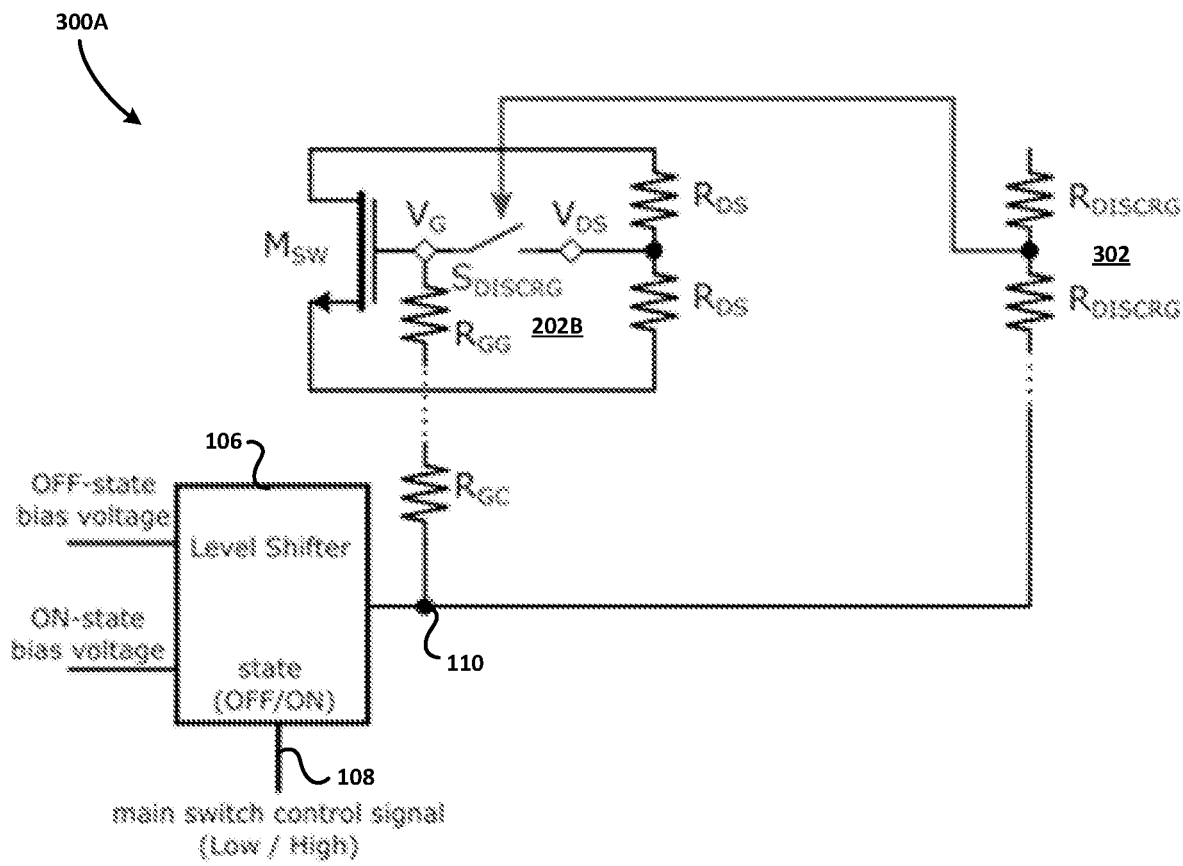
FIG. 3A is a schematic diagram of a single level shifter embodiment of an RF switch according to an embodiment.

FIG. 3A is a schematic diagram of a single level shifter embodiment of an RF switch 300A according to an embodiment. RF switch 300A comprises a single level shifter 106 and switch portion 202B, both previously described. In addition, RF switch 300A also includes a discharge switch control branch 302 for controlling the $S_{DISCRG}$ discharge switch, which is described in further detail below. The output 110 of the single level shifter 106 is coupled to switch portion 202 through resistor $R_{GC}$ and resistor $R_{GG}$. Resistor $R_{GG}$ is in turn coupled to the gate of transistor $M_{SW}$. The output 110 of the single level shifter 106 also discharges switch control branch 302, according to an embodiment.

The $S_{DISCRG}$ discharge switch is controlled by a dedicated discharge switch control branch 302 running in parallel with the drain-source resistive network 116 formed by a plurality of $R_{DS}$ resistors. In FIG. 3A, the discharge switch control branch 302 is constructed from a plurality $R_{DISCRG}$ resistors. The discharge switch control branch 302 may either be independently controlled according to the timing requirements for the $S_{DISCRG}$ discharge switch or the discharge switch control branch 302 may be controlled by the same level shifter used for the gates of the RF switch transistors. The values of the $R_{DISCRG}$ resistors are typically larger than the values of the $R_{DS}$ resistors in an embodiment. The RC time constant at the tapping nodes of the discharge switch control branch 302 is still substantially smaller than that of the gate resistive network 112.

The control signals to control the transistors ($M_{SW}$) of the main RF switch and corresponding discharge switches ($S_{DISCRG}$) may be taken from a common level shifter 106 providing the bias control voltages for both switches at the same time as demonstrated in FIG. 3A. Upon the arrival of the change state command, level shifter 106 activates (switches ON) the discharge switch $S_{DISCRG}$ via the ladder of bias resistors $R_{DISCRG}$ for the discharge switch $S_{DISCRG}$. When the gate-source and gate-drain voltages ($V_G$–$V_{DS}$) reach zero volts, the discharge switch $S_{DISCRG}$ deactivates locally and stays in the OFF state during operation until the arrival of the next change state command.

Figure 3B:
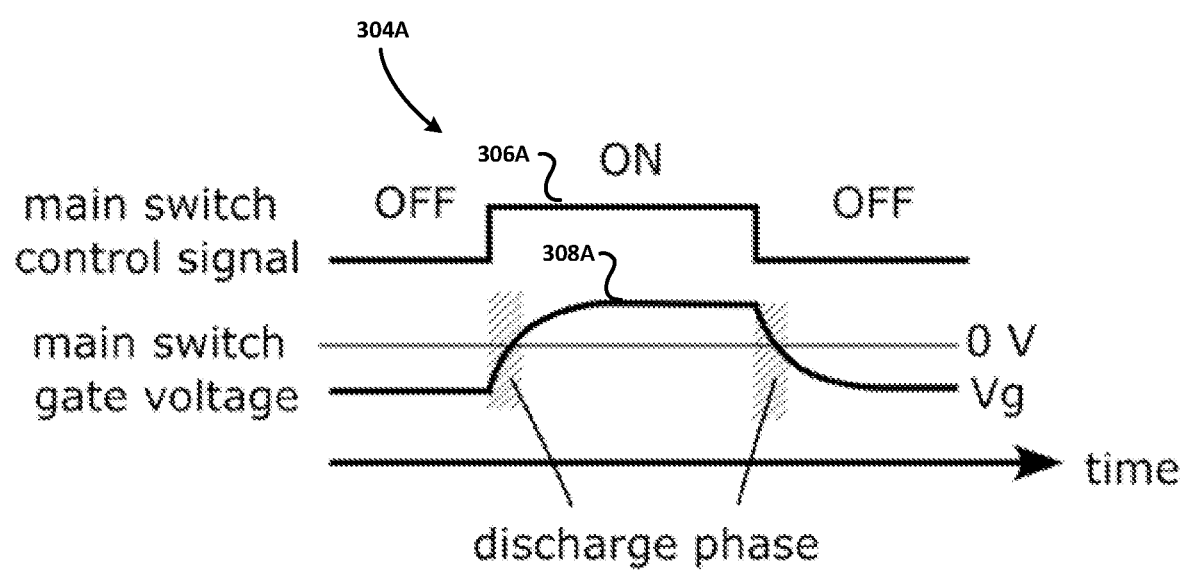
FIG. 3B is a timing diagram associated with the single level shifter embodiment of the RF switch of FIG. 3A.

FIG. 3B is a timing diagram 304A associated with the single level shifter embodiment of the RF switch of FIG. 3A, showing the control signal 306A for the transistors ($M_{SW}$) of the main RF switch and the corresponding control signal 308A for the discharge switch ($S_{DISCRG}$) in an embodiment. It is important to note that the discharge switch is active only during the discharge phase of the switching transient. For the single level shifter embodiment of FIG. 3A, the gate-source voltage serves as a mechanism for switching OFF the discharge switch $S_{DISCRG}$. When the output of the level shifter 106 changes from negative to positive voltage or vice versa, the $S_{DISCRG}$ switch switches ON and stays in the ON state until the voltage across the switch (Vg–Vds) reaches zero volts. Reaching zero volts across switch $S_{DISCRG}$ brings it into the OFF state, in which it remains until the next change in the main switch control signal 308A. The two discharge phases are noted in the main switch control signal 308A shown in FIG. 3B. The discharge phases last for a predetermined period of time after the rising edge of control signal 306A, and for a predetermined period of time after the falling edge of control signal 306A.

Figure 3C:
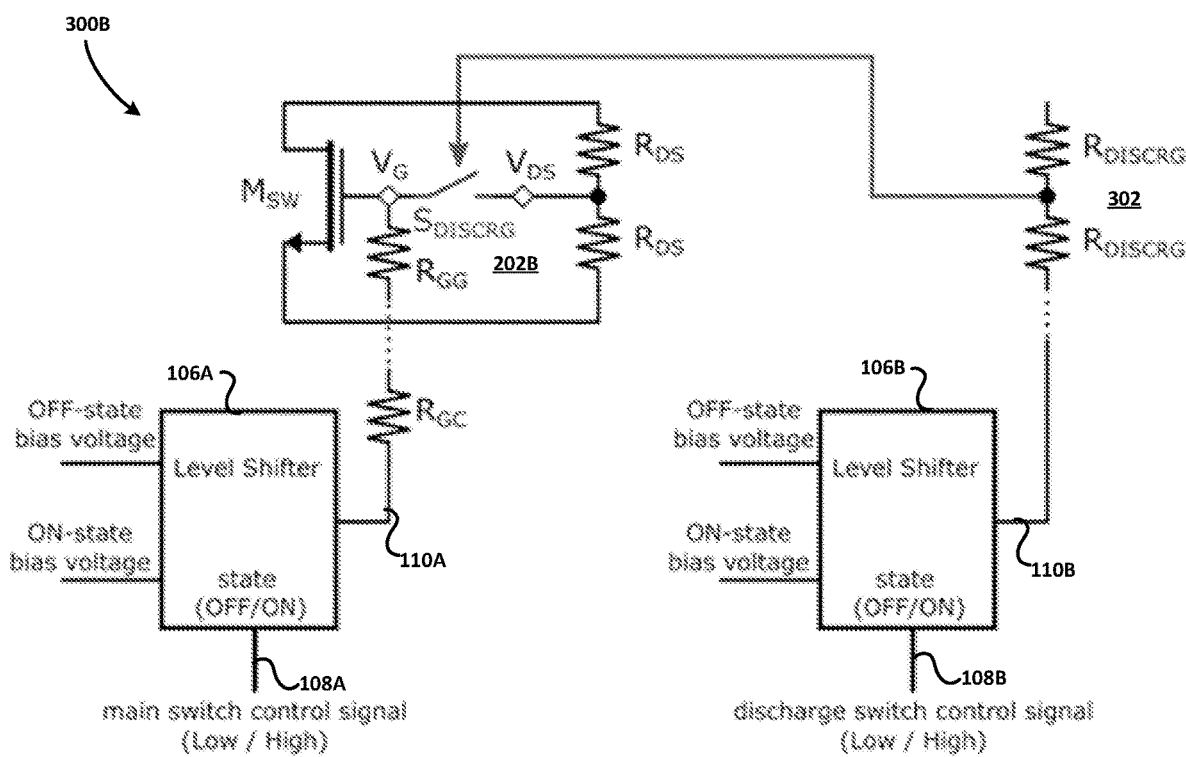
FIG. 3C is a schematic diagram of a dual level shifter embodiment of an RF switch according to an embodiment.

FIG. 3C is a schematic diagram of a dual level shifter embodiment of an RF switch 300B according to an embodiment, including a first level shifter 108A and a second level shifter 108B. A first output 110A of the first level shifter 108A is coupled to the switch portion 202B through resistor RGC and resistor RGG. In turn, resistor RGG is coupled to the gate of transistor $M_{SW}$. A second output 110B of the second level shifter 108B is coupled to the discharge switch control branch 302. The discharge switch $S_{DISCRG}$ is controlled independently from the main switch by means of a second level shifter 108B as shown in FIG. 3B. The second level shifter 108B activates the discharge switch $S_{DISCRG}$ for the discharge phase upon the arrival of the change state command for the main switch and disables the discharge switch during the rest period of time.

Figure 3D:
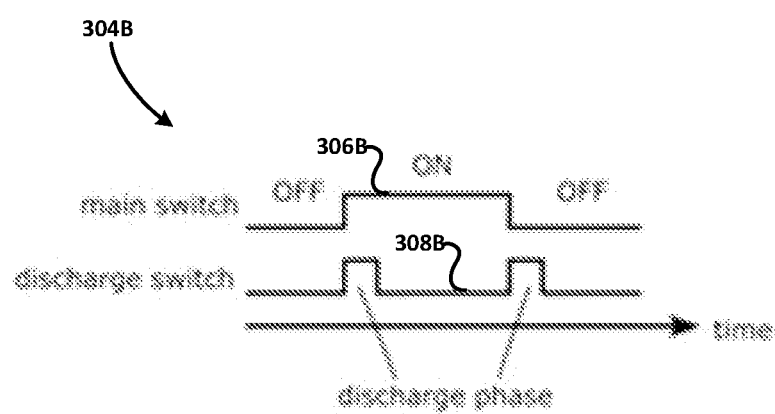
FIG. 3D is a timing diagram associated with the dual level shifter embodiment of the RF switch of FIG. 3C.

FIG. 3D is a timing diagram 304B associated with the dual level shifter embodiment 300B of the RF switch of FIG. 3B, showing the control signal 306B for the transistors ($M_{SW}$) of the main RF switch and the corresponding control signal 308B for the discharge switches ($S_{DISCRG}$) in an embodiment. It is important to note that the discharge switch is normally active only during the discharge phase of the switching transient. However, due to the configuration of the dual level shifter embodiment 300B, the control signals 306B and 308B are independently adjustable. In an embodiment, the length of each of the pulses in control signal 308B for example can be adjusted.

Figure 4:
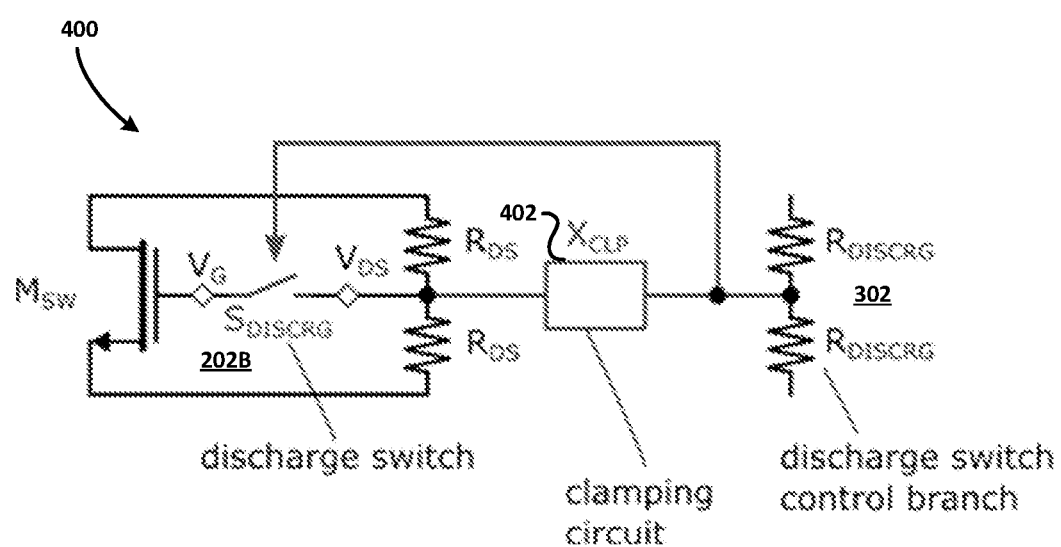
FIG. 4 is the schematic diagram of FIG. 2C, further including a clamping circuit coupled between the center tap of the drain-source resistor and a discharge switch control branch.

Further embodiments of the RF switch cell 400 including the discharge switch feature may additionally comprise a clamping circuit $X_{CLP}$ coupled between the discharge switch control branch 302 and a center tap ($V_{DS}$) of the drain-source resistive network 116, as shown in FIG. 4. The clamping circuit $X_{CLP}$ is configured to provide low-ohmic impedance between the two nodes of the clamping circuit at the operating frequency of the RF switch cell 400. In an embodiment, the clamping circuit keeps the potentials at the respective tapping points of the two resistive networks equal or close to each other at operating frequencies. If the equality of potentials is not sustained, then there is a risk of switch damage or overstress at large-signal RF excitation conditions.

Figure 5A:
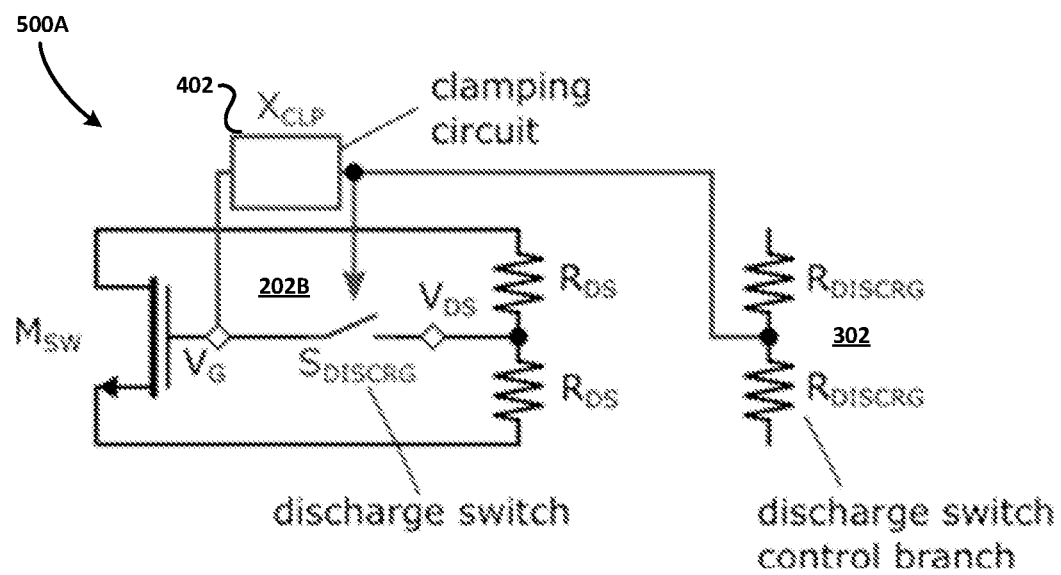
FIG. 5A is the schematic diagram of FIG. 2C, further including a clamping circuit coupled between the gate of the single transistor and the discharge switch control branch.

Alternatively, the clamping circuit $X_{CLP}$ may be coupled between the discharge switch control branch 302 and the gate of the switch transistor $M_{SW}$ as shown in the switch cell 500A of FIG. 5A. The purpose and functionality of switch cell 500A is identical to the previous clamping circuit embodiment shown in FIG. 4. The difference in the coupling points for the clamping circuit $X_{CLP}$ depends on the discharge switch control implementation and voltages used for controlling the discharge switch $S_{DISCRG}$.

Figure 5B:
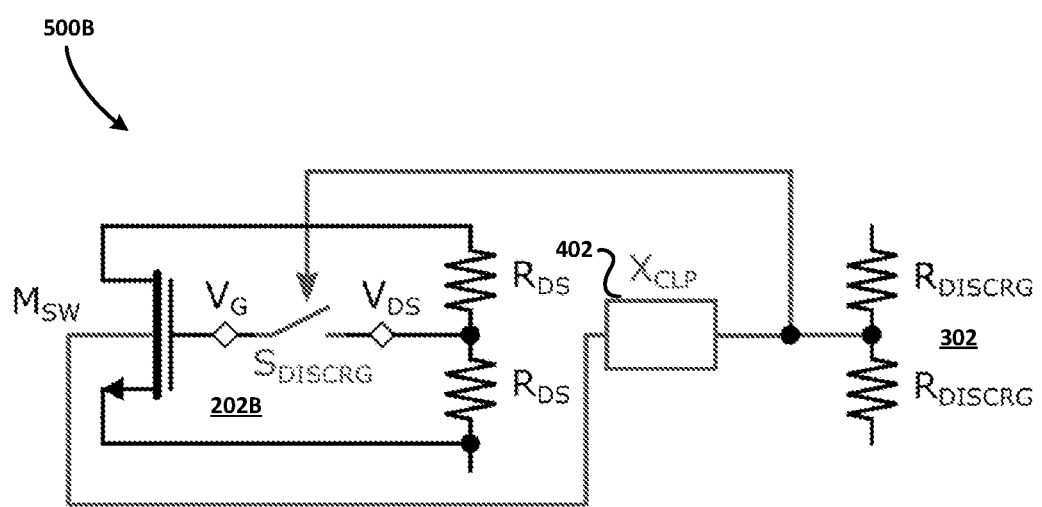
FIG. 5B is the schematic diagram of FIG. 2C, further including a clamping circuit coupled between a body terminal of the single transistor and the discharge switch control branch.

Yet another alternative of the application of clamping circuit $X_{CLP}$ is shown in the switch cell 500B of FIG. 5B, where the clamping circuit is coupled between the discharge switch control branch 302 and the body terminal of the switch transistor $M_{SW}$. From the RF operational point of view, the RF switch cell 400 of FIG. 4 is substantially equivalent to the switch cell 500B of FIG. 5B as it is assumed that the gate and body terminals of switch transistor $M_{SW}$ hold the same AC voltage.

During a switching transient, when the discharge switch $S_{DISCRG}$ is activated, the clamping circuit $X_{CLP}$ is either configured to have a high-impedance between the clamping nodes or the clamping circuit automatically has a high impedance at the switching transient event, for example, in case of the clamping circuit implementation having a frequency-dependent response. The clamping circuit $X_{CLP}$ might comprise a time-invariant and frequency-dependent device, e.g. a capacitor. The capacitor may have a high impedance during the switching transient and low impedance at the operating frequency. The value of the capacitor can be in the range of 5 fF to 1 pF for cellular applications.

In another embodiment, the clamping circuit $X_{CLP}$ can be implemented as a time-variant device, e.g. an RF MOSFET-based or MEMS ohmic switch $S_{CLP}$ (shown in FIG. 6), providing a conductive current path during RF operation and isolating current path during the switching transient, particularly during the discharge phase as previously discussed. The control signal for the ohmic clamping switch $S_{CLP}$ may be synchronized with the control signal for the discharge switch $S_{DISCRG}$ and is functionally inverted with respect to the discharge switch control signal, meaning, when the discharge switch is OFF, then the clamping switch in ON and vice versa.

Figure 6:
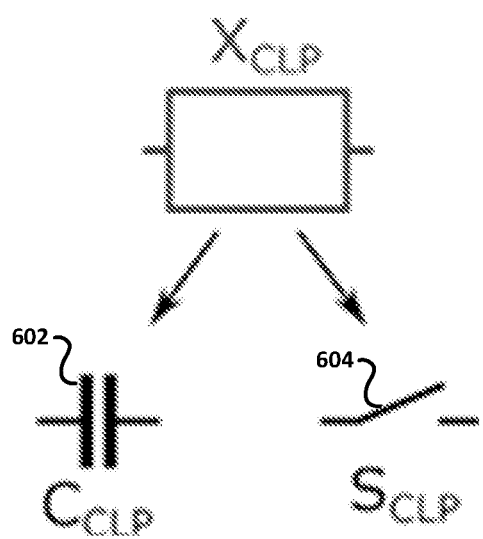
FIG. 6 is a schematic diagram of a capacitor embodiment and a switch embodiment of the clamping circuit.

FIG. 6 is a schematic diagram of a capacitor embodiment and a switch embodiment of the clamping circuit. Clamping circuit $X_{CLP}$ can comprise a capacitor $C_{CLP}$ 602 or a switch $S_{CLP}$ 604 as previously described.

Figure 7:
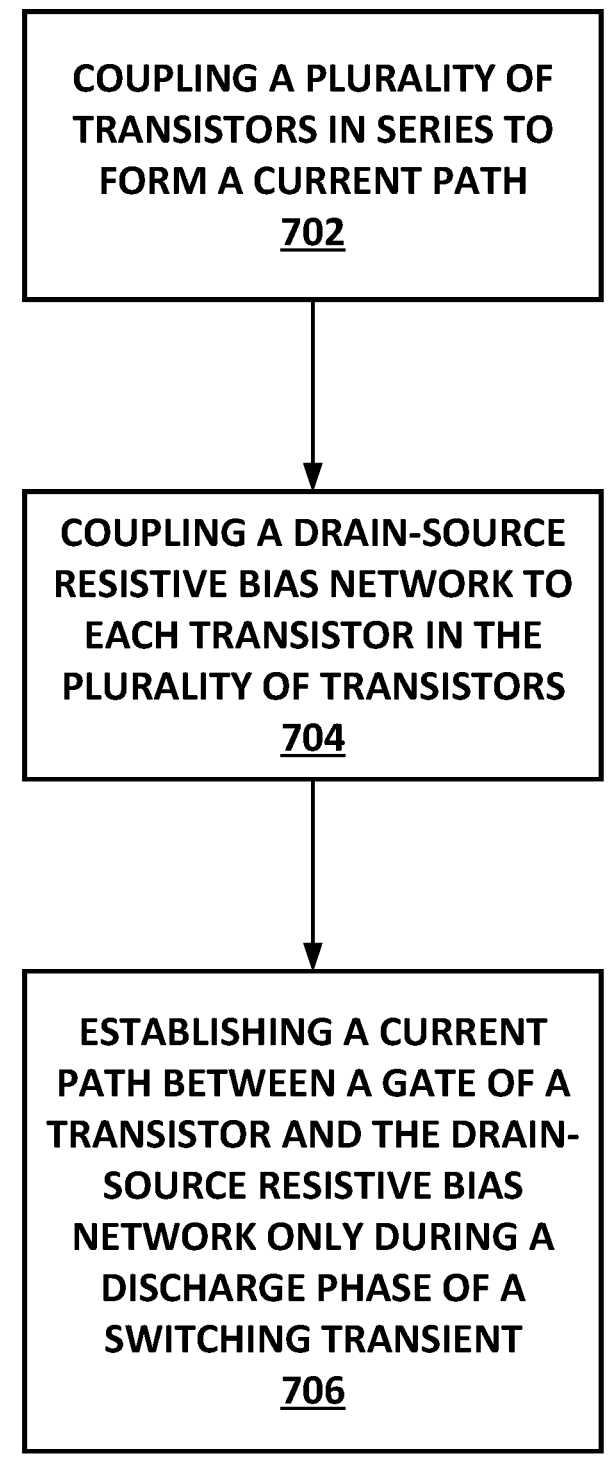
FIG. 7 is a flow chart of an embodiment method of operating an RF switch device.

FIG. 7 is a flow chart of an embodiment method of operating an RF switch device, the method comprising coupling a plurality of transistors in series to form a current path at step 702; coupling a drain-source resistive bias network to each transistor in the plurality of transistors at step 704; and establishing a current path between a gate of at least one transistor in the plurality of transistors and the drain-source resistive bias network only during a discharge phase of a switching transient of the RF switch device at step 706.

Example embodiments of the present invention are summarized here. Other embodiments can also be understood from the entirety of the specification and the claims filed herein.

Example 1. According to an embodiment, an RF switch device comprises a plurality of transistors coupled in series to form a current path; a drain-source resistive bias network coupled to a drain and a source of each transistor in the plurality of transistors; and a discharge switch coupled between a gate of at least one transistor in the plurality of transistors and the drain-source resistive bias network, wherein the discharge switch is configured to establish a current path between the gate of the at least one transistor in the plurality of transistors and the drain-source resistive bias network only during a switching transient of the RF switch device.

Example 2. The RF switch device of Example 1, wherein the discharge switch is coupled between the gate of at least one transistor in the plurality of transistors and a center tap of a resistor divider in the drain-source resistive bias network.

Example 3. The RF switch device of any of the above examples, wherein the discharge switch is coupled between the gate and drain of at least one transistor in the plurality of transistors.

Example 4. The RF switch device of any of the above examples, wherein the discharge switch is configured to establish the current path only during a discharge phase of the switching transient of the RF switch device.

Example 5. The RF switch device of any of the above examples, wherein the discharge switch comprises an NMOS transistor, a PMOS transistor, or a parallel connection of the NMOS transistor and the PMOS transistor.

Example 6. The RF switch device of any of the above examples, further comprising a gate bias network coupled to gate terminals of each transistor in the plurality of transistors.

Example 7. The RF switch device of any of the above examples, further comprising a discharge switch control branch in parallel with the drain-source resistive bias network.

Example 8. The RF switch device of any of the above examples, wherein a control node of the discharge switch is coupled to the discharge switch control branch.

Example 9. The RF switch device of any of the above examples, wherein the drain-source resistive bias network and the discharge switch control branch receive a common control signal.

Example 10. The RF switch device of any of the above examples, wherein the common control signal is generated by a level shifter.

Example 11. The RF switch device of any of the above examples, wherein the drain-source resistive bias network and the discharge switch control branch receive first and second control signals.

Example 12. The RF switch device of any of the above examples, wherein the first control signal is generated by a first level shifter and the second control signal is generated by a second level shifter.

Example 13. The RF switch device of any of the above examples, further comprising a clamp circuit coupled to the discharge switch control branch.

Example 14. The RF switch device of any of the above examples, wherein the clamp circuit is coupled between the drain-source resistive bias network and the discharge switch control branch.

Example 15. The RF switch device of any of the above examples, wherein the clamp circuit is coupled between the gate of the at least one transistor in the plurality of transistors and the discharge switch control branch.

Example 16. The RF switch device of any of the above examples, wherein the clamp circuit is configured to have a high impedance during the switching transient and a low impedance at an operating frequency of the RF switch device.

Example 17. The RF switch device of any of the above examples, wherein the clamp circuit comprises a capacitor.

Example 18. The RF switch device of any of the above examples, wherein the clamp circuit comprises a switch.

Example 19. According to an embodiment, an RF switch device comprises a plurality of transistors coupled in series to form a current path; and a drain-source resistive bias network coupled to each transistor in the plurality of transistors, wherein the RF switch device is configured to establish a current path between a gate of at least one transistor in the plurality of transistors and the drain-source resistive bias network only during a discharge phase of a switching transient of the RF switch device.

Example 20. According to an embodiment, a method of operating an RF switch device comprises coupling a plurality of transistors in series to form a current path; coupling a drain-source resistive bias network to each transistor in the plurality of transistors; and establishing a current path between a gate of at least one transistor in the plurality of transistors and the drain-source resistive bias network only during a discharge phase of a switching transient of the RF switch device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF switch device comprising:
a plurality of transistors coupled in series to form a current path;
a drain-source resistive bias network coupled to a drain and a source of each transistor in the plurality of transistors; and
a discharge switch coupled between a gate of at least one transistor in the plurality of transistors and the drain-source resistive bias network,
wherein the discharge switch is configured to establish a current path between the gate of the at least one transistor in the plurality of transistors and the drain-source resistive bias network only during a switching transient of the RF switch device.

2. The RF switch device of claim 1, wherein the discharge switch is coupled between the gate of at least one transistor in the plurality of transistors and a center tap of a resistor divider in the drain-source resistive bias network.

3. The RF switch device of claim 1, wherein the discharge switch is coupled between the gate and drain of at least one transistor in the plurality of transistors.

4. The RF switch device of claim 1, wherein the discharge switch is configured to establish the current path only during a discharge phase of the switching transient of the RF switch device.

5. The RF switch device of claim 1, wherein the discharge switch comprises an NMOS transistor, a PMOS transistor, or a parallel connection of the NMOS transistor and the PMOS transistor.

6. The RF switch device of claim 1, further comprising a gate bias network coupled to gate terminals of each transistor in the plurality of transistors.

7. The RF switch device of claim 6, further comprising a discharge switch control branch in parallel with the drain-source resistive bias network.

8. The RF switch device of claim 7, wherein a control node of the discharge switch is coupled to the discharge switch control branch.

9. The RF switch device of claim 8, wherein the drain-source resistive bias network and the discharge switch control branch receive a common control signal.

10. The RF switch device of claim 9, wherein the common control signal is generated by a level shifter.

11. The RF switch device of claim 7, wherein the drain-source resistive bias network and the discharge switch control branch receive first and second control signals.

12. The RF switch device of claim 11, wherein the first control signal is generated by a first level shifter and the second control signal is generated by a second level shifter.

13. The RF switch device of claim 9, further comprising a clamp circuit coupled to the discharge switch control branch.

14. The RF switch device of claim 13, wherein the clamp circuit is coupled between the drain-source resistive bias network and the discharge switch control branch.

15. The RF switch device of claim 13, wherein the clamp circuit is coupled between the gate of the at least one transistor in the plurality of transistors and the discharge switch control branch.

16. The RF switch device of claim 13, wherein the clamp circuit is configured to have a high impedance during the switching transient and a low impedance at an operating frequency of the RF switch device.

17. The RF switch device of claim 13, wherein the clamp circuit comprises a capacitor.

18. The RF switch device of claim 13, wherein the clamp circuit comprises a switch.

19. An RF switch device comprising:
a plurality of transistors coupled in series to form a current path; and
a drain-source resistive bias network coupled to each transistor in the plurality of transistors,
wherein the RF switch device is configured to establish a current path between a gate of at least one transistor in the plurality of transistors and the drain-source resistive bias network only during a discharge phase of a switching transient of the RF switch device.

20. A method of operating an RF switch device, the method comprising:

coupling a plurality of transistors in series to form a current path;

coupling a drain-source resistive bias network to each transistor in the plurality of transistors; and establishing a current path between a gate of at least one transistor in the plurality of transistors and the drain-source resistive bias network only during a discharge phase of a switching transient of the RF switch device.

\* \* \* \* \*

UNITED STATES PATENT AND TRADEMARK OFFICE
CERTIFICATE OF CORRECTION

| | | |
|---|---|---|
| PATENT NO. | : 12,199,596 B2 | Page 1 of 1 |
| APPLICATION NO. | : 18/327525 | |
| DATED | : January 14, 2025 | |
| INVENTOR(S) | : Valentyn Solomko, Semen Syroiezhin and Andreas Bänisch | |

It is certified that error appears in the above-identified patent and that said Letters Patent is hereby corrected as shown below:

In the Claims

In Column 10, Line 4, Claim 2:
Change "switch is coupled between the gate of at least one transistor"
To --switch is coupled between the gate of the at least one transistor--

In Column 10, Line 8, Claim 3:
Change "switch is coupled between the gate and drain of at least one"
To --switch is coupled between the gate and drain of the at least one--

Signed and Sealed this
Eighth Day of April, 2025

Coke Morgan Stewart
*Acting Director of the United States Patent and Trademark Office*